US006268772B1

United States Patent
Chen

(10) Patent No.: US 6,268,772 B1
(45) Date of Patent: Jul. 31, 2001

(54) SLEW RATE CONTROLLED POWER AMPLIFIER

(75) Inventor: Ching-Siang Chen, Laguna Niguel, CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/440,488

(22) Filed: Nov. 15, 1999

(51) Int. Cl.[7] ....................................... H03F 3/04
(52) U.S. Cl. ..................... 330/288; 330/290; 323/315; 318/432
(58) Field of Search ........................ 330/288, 290, 330/300; 323/315, 316; 318/432, 254, 138, 439

(56) References Cited

U.S. PATENT DOCUMENTS

| 5,525,927 | * | 6/1996 | Yung et al. ................ 327/543 |
| 5,570,060 | * | 10/1996 | Edwards ................... 327/541 |
| 5,614,797 | * | 3/1997 | Carobolante ............... 318/432 |
| 5,661,383 | * | 8/1997 | Schlager et al. ............ 318/439 |
| 5,754,066 | * | 5/1998 | Smith ...................... 327/108 |
| 6,107,789 | * | 8/2000 | Fryer et al. ............... 323/316 |

* cited by examiner

*Primary Examiner*—Robert Pascal
*Assistant Examiner*—Henry Choe
(74) *Attorney, Agent, or Firm*—W. Daniel Swayze, Jr.; W. James Brady; Frederick J. Telecky, Jr.

(57) ABSTRACT

A slew rate controlled power amplifier (112) for use in a dc motor driver circuit is presented. The amplifier (112) has a power transistor (72) connected to control a drive current ($I_{MOTOR}$) in a phase of the dc motor with which it is associated and to develop an output voltage ($V_{OUT}$) on the phase in accordance with the drive current ($I_{MOTOR}$). A mirror transistor (74) is connected to establish the ratioed magnitude of the current in the power transistor (72), and a feedback circuit (90) is connected to controllably feed back the output voltage ($V_{OUT}$) to the mirror transistor (74) to control the drive current ($I_{MOTOR}$). A commutatively operated slew-rate control circuit (57,58) is connected to the feedback circuit (90) to control the drive current ($I_{MOTOR}$). By coupling the feedback from the phase voltage, $V_{OUT}$, into the current loop the loop stability is greatly improved and oscillations on the output phase voltage are reduced or eliminated. The circuit may also have a voltage-equalizing transistor (78) in series with the mirror transistor (74) and a differential amplifier (85) to develop a bias voltage to the voltage-equalizing transistor (78) based on the difference between the output voltage and a voltage in the mirror current flowpath. By equalizing the output and current mirror flowpath voltages, the linearity of the power amplifier is greatly improved during current slew.

32 Claims, 5 Drawing Sheets

SLEW RATE CONTROLLED POWER AMPLIFIER

BACKGROUND OF THE INVENTION

1. Field of the Invention

This invention relates to improvements in mass data storage devices, or the like, and more particularly to improvements in polyphase dc motor driver circuits for use in mass data storage devices, or the like, and still more particularly to improvements in circuits used to control the commutation current slew rate in polyphase dc motor driver circuits for use in mass data storage devices, or the like.

2. Relevant Background

A conventional low-side current-mode power amplifier circuit 10 used in the prior art is shown in FIG. 1. The circuit may be used as a low-side driver circuit in a commutated motor drive circuit with an accompanying high-side driver circuit (not shown). The power amplifier 10 is connected to drive to a low potential one phase of a DC motor (not shown), which may include multiple phases, typically three phases, to which current is commutatively switched in known manner.

More particularly, the circuit 10 is connected to one of the coils 12 of the motor to sink current in the phase through a NMOS transistor 14. The NMOS transistor 14 is referred to herein as a power FET. A resistance 16 is associated with the coil 12 of value $R_M$. The inductance of the coil 12 is $L_M$.

As shown in FIG. 1, a linear reference current input is converted into a voltage across resistor 26. The voltage is then provided to the non-inverting node of an OTA 22 whose output drives the gate of the power FET 14 as well as a mirror FET 20. An identical or ratioed magnitude of the current in the mirror FET 20 is thus mirrored by the diode-connected FET 32 in its mirror FET 30 and then converted into a voltage across resistor 24 and fed back to the inverting node of the OTA 22. The high gain of the OTA 22 forces the currents flowing through resistors 24 and 26 to be substantially equal provided that resistors 24 and 26 are equal. The dominant pole of this circuit is set by the gate capacitance of the power FET 14.

The current through the mirror FET 20 is controlled by the OTA 22 which has an inverting input connected to a resistor 24 through which a current flows and a non-inverting input connected to a resistor 26 through which a reference current supplied by a constant current source 28 flows. The diode-connected FET 32 with its mirror FET 30 controls the current through resistor 24. It should be noted that the current $I_{MOTOR}$ through the power FET 14 is proportional to the current through the mirror FET 20. Thus, controlling the current though the mirror FET 20 provides a means to control the current through the power FET 14.

However, the current flowing through the mirror FET 20 is not linearly proportional to the current flowing through the power FET 14, due to possibly substantial difference in their drain-to-source voltages in both transient and steady-stage responses. Most of all, the design of the OTA can be rather difficult due to the low-frequency pole introduced by the inherent motor inductance $L_M$ and the motor resistance $R_M$. In most cases, the loop bandwidth must be severely compromised to guarantee the loop stability.

SUMMARY OF THE INVENTION

According to a broad aspect of the invention, a slew rate controlled power amplifier for use in a dc motor driver circuit is presented. The amplifier has a power transistor connected to control a drive current in a phase of the dc motor with which it is associated and to develop an output voltage on the phase in accordance with the drive current. A mirror transistor is connected to establish a ratioed magnitude of the current in the power transistor, and a feedback circuit connected to controllably feed back the output voltage to the mirror transistor to control the drive current. A commutatively operated slew-rate control circuit is connected to the feedback circuit to control the drive current. The amplifier may also include a voltage-equalizing transistor in series with the mirror transistor. An amplifier may be connected with a first input connected between the voltage-equalizing transistor and the mirror transistor, a second input connected to the output voltage and an output connected to control a current in the voltage-equalizing transistor, so that the voltage-equalizing transistor tends to equalize voltages applied to the first and second inputs.

According to another broad aspect of the invention, a driver circuit for a phase of a dc motor is presented. The driver circuit includes a power transistor connected to control a drive current in a phase of the dc motor and to develop an output voltage on the phase. A mirror transistor is connected to establish a ratioed magnitude of the drive current. A current flowpath is established through a resistor to provide a reference voltage to one input of an amplifier, and a feedback current flowpath is connected to receive the output voltage to feed back a voltage to another input of the amplifier. A bias current flowpath controlled by a commutatively operated slew-rate control circuit establishes a bias in the feedback current flowpath to control the current therein and the voltage fed back to the amplifier. A voltage-equalizing transistor may be provided in series with the mirror transistor, controlled by an amplifier having a first input connected between the voltage-equalizing transistor and the mirror transistor and a second input connected to the output voltage The voltage-equalizing transistor tends to equalize voltages applied to the first and second inputs.

According to yet another broad aspect of the invention, a driver circuit is presented for a phase of a dc motor. The driver circuit has a power transistor connected to control a drive current in the phase and to develop an output voltage on the phase. A mirror transistor establishes a ratioed magnitude of the current in the power transistor, and a current flowpath includes a resistor, connected to develop a control voltage for application to the non-inverting input of an amplifier. A feedback circuit feeds back a voltage developed on the output node to the inverting input of the amplifier. A voltage-equalizing transistor is connected in series with the mirror transistor. An amplifier has a first input connected between the voltage equalizing transistor and the mirror transistor, a second input connected to the output voltage and an output connected to control a current in the voltage equalizing transistor, whereby the first and second inputs tend to have equal voltage.

According to still another broad aspect of the invention, a method is presented for driving a dc motor. The method includes controlling an output current in a phase of the dc motor to develop an output voltage on the phase. The output current is controlled according to a mirror current of a current mirror circuit, and feeding back the output voltage to the current mirror circuit to control the mirror current and the output current in accordance with a predetermined slew rate.

One advantage provided by the invention is that a linear power amplifier can be provided for HDD mobile servo applications such that the slew rate of the current flowing through the power FET is well controlled while the high-frequency stability of the phase voltage is maintained.

BRIEF DESCRIPTION OF THE DRAWINGS

The invention is illustrated in the accompanying drawings, in which.

In the various figures of the drawing, like reference numerals are used to denote like or similar parts.

DETAILED DESCRIPTION OF THE PREFERRED EMBODIMENTS

Figure 1:
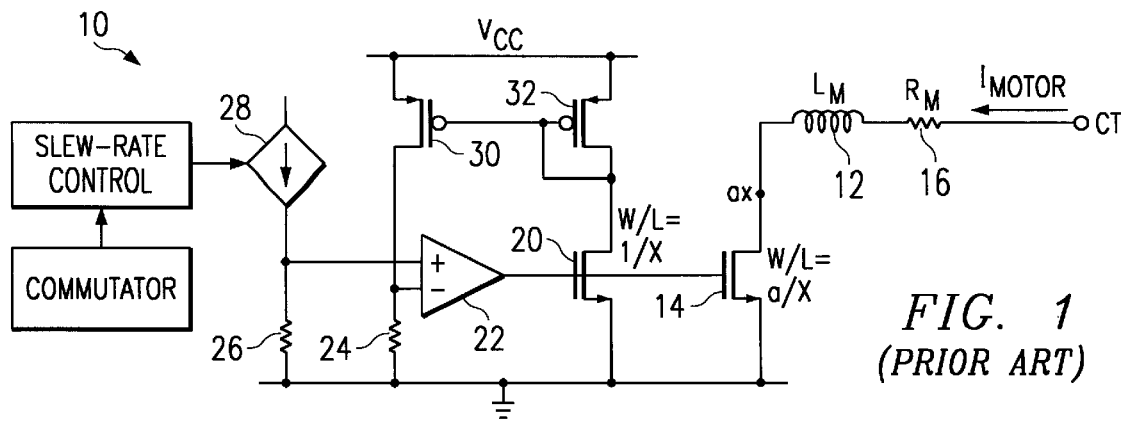
FIG. 1 is an electrical schematic diagram of a conventional current-mode amplifier, in accordance with the prior art.

A portion of a motor driving circuit 100 is shown in FIG. 1, in which power driver circuits of the invention may be used, for example, for driving a brushless 3-phase DC motor (not entirely shown). The motor may, for instance, be used to turn a spindle of a mass data storage device, such as a hard disk drive, DVD drive, CDROM drive, or the like (not shown). The circuit 100 includes a Y-connected coil arrangement 101 that forms a part of the motor. The Y-connected coils include three coils 103, 105, 109, connected together at a center tap point, CT, 107. The opposite ends of the coils are denoted as nodes "A", "B", and "C". To properly spin the motor, the coils are energized in a predetermined sequence. More particularly, currents are passed through the coils 103, 105, and 109, in a predetermined sequence through the operation of respective high-side and low-side drivers associated with each coil. Still more particularly, each coil has an associated high-side driver and an associated low-side driver that respectively apply high and low voltages to the free node of the associated coil.

Thus, coil 103 has an associated high-side driver 110 and an associated low-side driver 112 connected to node "A" to apply high and low (or ground) driving potentials to the node "A", in accordance with a timed commutation sequence established by a commutator circuit 114. Similarly, node "B" of coil 109 has an associated high-side driver 116 and an associated low-side driver 118. Finally, node "C" of coil 105 has an associated high-side driver 120 and an associated low-side driver 122.

Figure 2:
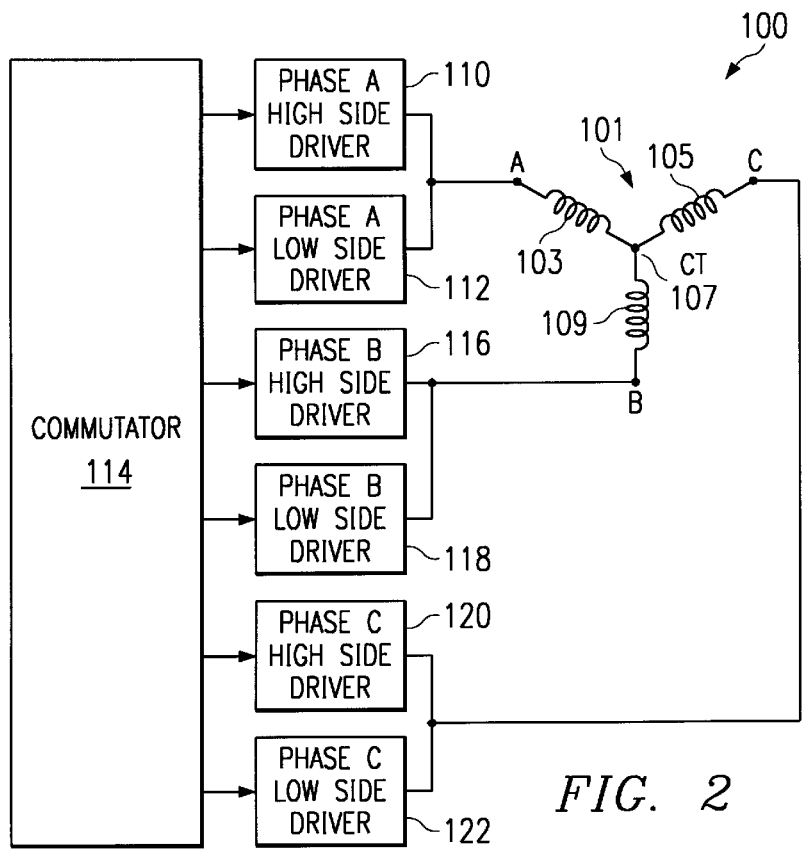
FIG. 2 is a box diagram showing a portion of a motor driver system for driving a 3-phase DC motor, in accordance with a preferred embodiment of the invention.
Figure 3:
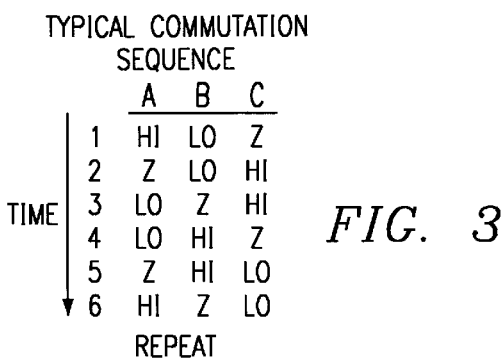
FIG. 3 is a table showing the voltages at the coil nodes opposite the common "Y" interconnection point during the various commutation phases in the operation of the circuit of FIG. 2.

The commutator operates or activates the respective high and low-side drivers in a predetermined sequence so that currents are passed through respective pairs of the coils according to the commutation sequence. For example, initially high-side driver 110 may be activated to produce a high voltage on node "A", while low-side driver 118 is activated to produce a low voltage, or ground, on node "B". This results in a current flowing through coils 103 and 109 from node "A" to node "B". Node "C", meanwhile, is tristated, or floats. In the next communication sequence, for example, the high-side driver 110 may be deactivated to allow node "A" to float, and high-side driver 120 may be activated to apply a high voltage to node "C". In this state, the current flows through coils 105 and 109 from node "C" to node "B". This process is continued through a number of commutation sequences. An example of a suitable commutation sequence is shown in FIG. 2.

In order to apply the particular voltage transition from low to high or high to low to the respective nodes A–C, in many applications it is desirable to provide a current slew as the driver to the respective nodes is activated or deactivated according to the commutation sequence. Since a step function contains many frequencies, including high frequencies, the direct application of step function voltage changes to the nodes may result in undesirable defects in the motor operation, such as acoustic/electrical noise, torque ripples, and the like. Thus, at a minimum, a linear ramp slew increase or decrease may result in improved motor performance. Other slew waveforms may also be employed.

Thus, each of the high and low-side drivers shown in FIG. 1 may have a slew control circuit, described below in detail, associated with it to control the application or removal of the high or low voltages from the respective nodes A–C.

Figure 4:
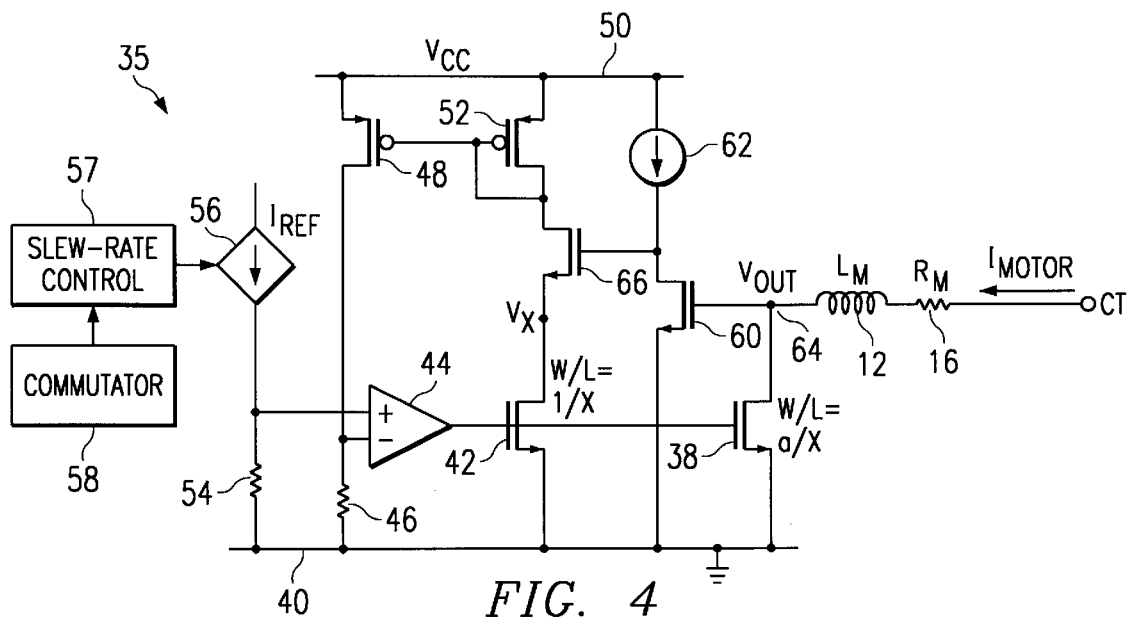
FIG. 4 is an electrical schematic diagram of a current-mode power amplifier embodiment.

A power amplifier circuit 35 that may be employed, for example, as a low-side driver is shown in FIG. 4. (It should be noted that a similar high-side driver may be employed, for instance, with the polarities of the transistors, $V_{CC}$, and ground rails reversed.) The circuit 35 switchably sinks current from the coil 12 and its associated (non-ideal) resistor 16 from one phase of a multiphase DC motor, of the type described above, through a power FET 38 to a ground rail 40. The magnitude of current allowed to flow through the power FET 38 is controlled by a mirror FET 42, the gate voltage of which is controlled by a high-gain differential amplifier 44.

The voltage that is applied to the inverting input of the amplifier 44 is developed in a feedback current path across a resistor 46, having a current sourcing transistor 48 connected between it and the power supply rail 50. A current is supplied to the mirror FET 42 by a diode-connected PMOS transistor 52. A control voltage is applied to the non-inverting input of the amplifier 44, being developed across a resistor 54 through which a current, $I_{REF}$, from a dependent current source 56 is passed. The current generated by the dependent current source 56 is controlled by a slew-rate control circuit 57, which applies a predetermined slew waveform to the dependent current source 56 when activated by a commutator 58. The dependent current source 56 responds to the slew-rate control circuit 57 to produce a current through resistor 54 having the same wave shape as that dictated by the slew-rate control circuit. Thus the voltage applied to the non-inverting input of the differential amplifier 44 also follows the slew wave shape.

Consequently, when the commutator 58 selects the low-side driver circuit 35, it activates the slew-rate control circuit 57, which controls the current generated by the dependent current source 56 to increase according to the predetermined slew rate. The mirror transistor 42 and, consequently, the power transistor 38 are therefore biased into conduction, also following the slew waveform. Since the circuit illustrated is a low-side driver, the power transistor 38 operates to turn on the sinking current, again, following the slew waveform. When the commutator 58 operates to de-select the low-side driver circuit 35, the slew-rate control circuit 57 controls the dependent current source 56 to decrease the current through the resistor 54, if desired, following a predetermined slew waveform, thereby shutting off the current through the power transistor 38, again, following the slew waveform.

The circuit 35 also has a first NMOS transistor 60 in a current flow path in which the current is supplied by a current source 62 between the power supply 50 and ground 40 rails. This level-shifter raises the voltage of the output node 64 by one threshold voltage ($V_T$) above the phase voltage developed between the source and drain of the power transistor 38. Additionally, a second NMOS transistor 66 is provided in series with the mirror transistor 42. The transistor 66 lowers the voltage on the mirror transistor 66 by one $V_T$. This forces voltage at $V_X$ to be approximately equal to the output voltage, $V_{OUT}$. Thus, the linearity of the current ratio between the power transistor 38 and the mirror transistor 42 is greatly improved. However, the low-frequency pole introduced by $L_M$ and $R_M$ will unavoidably interact with the current control loop and may adversely affect the loop stability. As a result, an unacceptable large-amplitude oscillation with a small-amplitude phase current ringing on the phase voltage may be observed.

Figure 5:
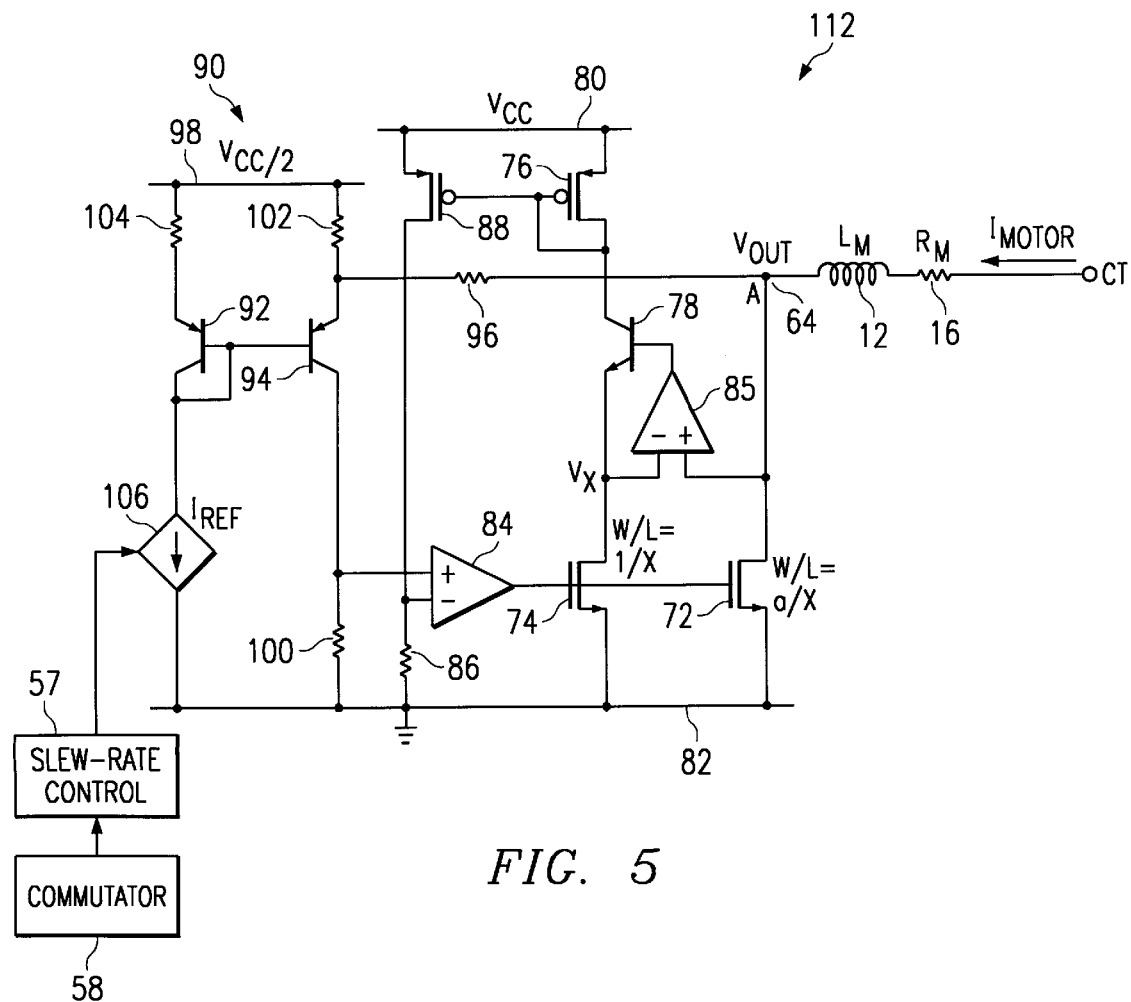
FIG. 5 shows an electrical schematic diagram of a current-mode power amplifier used as a low-side power driver circuit, in accordance with a preferred embodiment of the invention.
Figure 6:
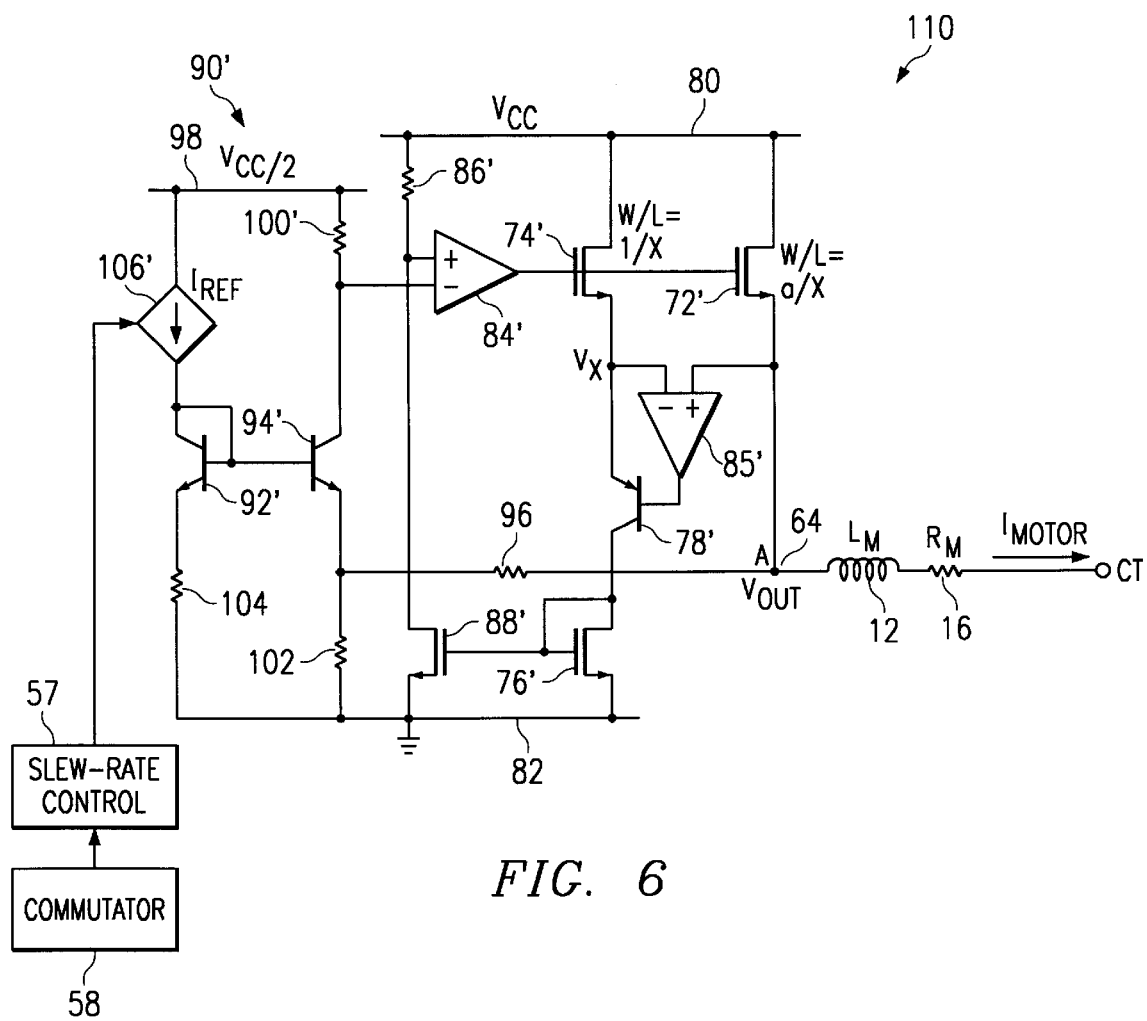
FIG. 6 shows and electrical schematic diagram of a current-mode power amplifier used as a high-side power driver circuit, in accordance with a preferred embodiment of the invention.

An electrical schematic diagram of a current-mode power amplifier 112, according to a preferred embodiment of the invention, is shown in FIG. 5. The power amplifier 112 is a low-side driver. A high-side driver circuit 110 is shown in FIG. 6. The components of the high-side driver 110 correspond to the components of the low-side driver 112, except for the transistor types and amplifier polarities; consequently, the reference numerals used to denote parts of the high-side driver circuit 110 that correspond to parts of the low-side driver circuit 112 are denoted with a prime ('). The high and low-side drivers of FIGS. 5 and 6 are shown associated with a single coil 103 and its associated inherent resistance at node "A" associated with a single phase of the motor. It should be understood that similar circuits are provided for each of the other phases of the motor.

With reference particularly to the low-side driver circuit 112, the circuit 112 includes a power transistor 72 that connects the output node 64 to ground to sink current, $I_{MOTOR}$, from the coil 12 and resistor 16 of the motor phase with which the circuit 112 is associated. A mirror transistor 74 controls the current that flows through the power transistor 72. The mirror transistor 74 is in series with a diode-connected load transistor 76 and a voltage-equalizing transistor 78 between a supply rail 80 and a ground rail 82. (The operation of the voltage-equalizing transistor is described below in detail.)

The high-gain differential amplifier 84 feeds back the voltage on output node 64 to the gate of the mirror transistor 74, in a manner below described. The input to the inverting input of the high-gain differential amplifier 84 is developed across a resistor 86, which is in series with load transistor 88 between the power supply rail 80 and the ground rail 82, in a manner similar to that described above with reference to the circuit 35 of FIG. 4.

A voltage control circuit 90 provides a control voltage to the non-inverting input of the high-gain differential amplifier 84. The voltage control circuit 90 includes a first current flowpath having two bipolar PNP transistors 92 and 94. The transistor 94 is connected in a common-base configuration, with the signal input to it being applied at its emitter from the voltage output node 64, and with its base bias being provided by a second current flowpath described below.

A series resistor 96 may be provided to scale the value of the input to the transistor 94, which is in series with a resistor 102 connected to a reference voltage 98. The combination of the resistors 96 and 102 provide a voltage divider to establish the voltage on the emitter of the transistor 94 and to set the feedback gain. A resistor 100 is connected between the collector of the transistor 94 and the ground rail 82, across which the voltage to the non-inverting input of the amplifier 84 developed.

In the second current flowpath, a transistor 92 is diode connected between the reference voltage 98 and the ground rail 82, with a load resistor 104 connected between the emitter and the reference voltage 98 and a dependent current source 106 connected between the collector/base and the ground rail 82. As mentioned, the base of transistor 92 is connected to the base of transistor 94. Preferably, transistors 92 and 94 are identically constructed.

The current in the dependent current flowpath is controlled by the slew-rate control circuit 57 and commutator 58. It should be noted that the reference voltage 98 might be biased at a voltage, for example, $V_{CC}/2$, such that the phase voltage on the motor coils is biased closely to one-half of the supply voltage $V_{CC}$ when the respective coil is sequenced to float. In this manner, the headroom of the power FET pair 72 and 72' is optimized in operation.

In operation, by coupling the feedback from the phase voltage, $V_{OUT}$, into the current loop through the common-base amplifier 94, the loop stability is greatly improved. The base of transistor 94 is biased through an identical transistor 92, the load resistor 104, and the input reference current $I_{REF}$. The resistor 96 provides a high-frequency feedback of the phase voltage to the current loop, thus reducing or eliminating oscillations on the output phase voltage.

Additionally shown in FIG. 5 is a second high-gain differential amplifier 85, which serves as a simple current sense amplifier. This is used in conjunction with NPN transistor 78 to replace the level-shifter transistor described above in the circuit 35 of FIG. 4. The high gain of this current sense amplifier 85 forces the drain-to-source voltages of the power FET 72 and the mirror FET 74 to be substantially the same. Thus, the linearity of the power amplifier is greatly improved during current slew.

Figure 7:
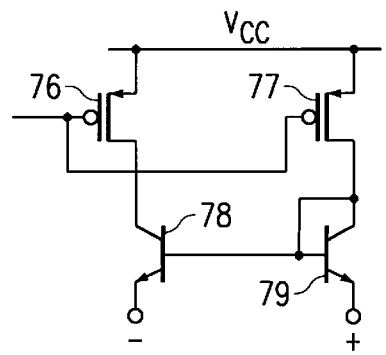
FIG. 7 shows an electrical schematic diagram of a current sense amplifier used in a low-side power driver circuit, in accordance with a preferred embodiment of the invention.
Figure 8:
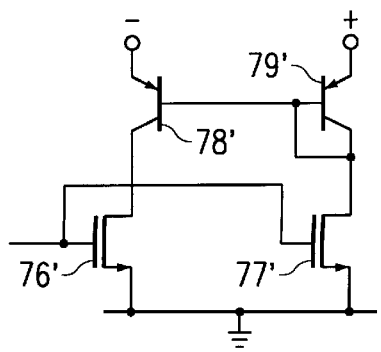
FIG. 8 shows an electrical schematic diagram of a current sense amplifier used in a high-side power driver circuit, in accordance with a preferred embodiment of the invention.

A simple current sense amplifier used in a low-side power driver circuit is shown in FIG. 7, in which the voltage-equalizing transistor is realized as a common-base amplifier that is biased by a diode-connected transistor 79 connected to the output voltage. A load transistor 77 of the transistor 79 is biased by a load transistor 76 of the transistor 78. Thus, a single-stage, high-gain amplifier is formed with its two inputs, the emitters of transistors 78 and 79, to be forced to be substantially the same in operation. In a similar manner, a simple current sense amplifier used in a high-side power driver circuit is shown in FIG. 8.

Figure 9:
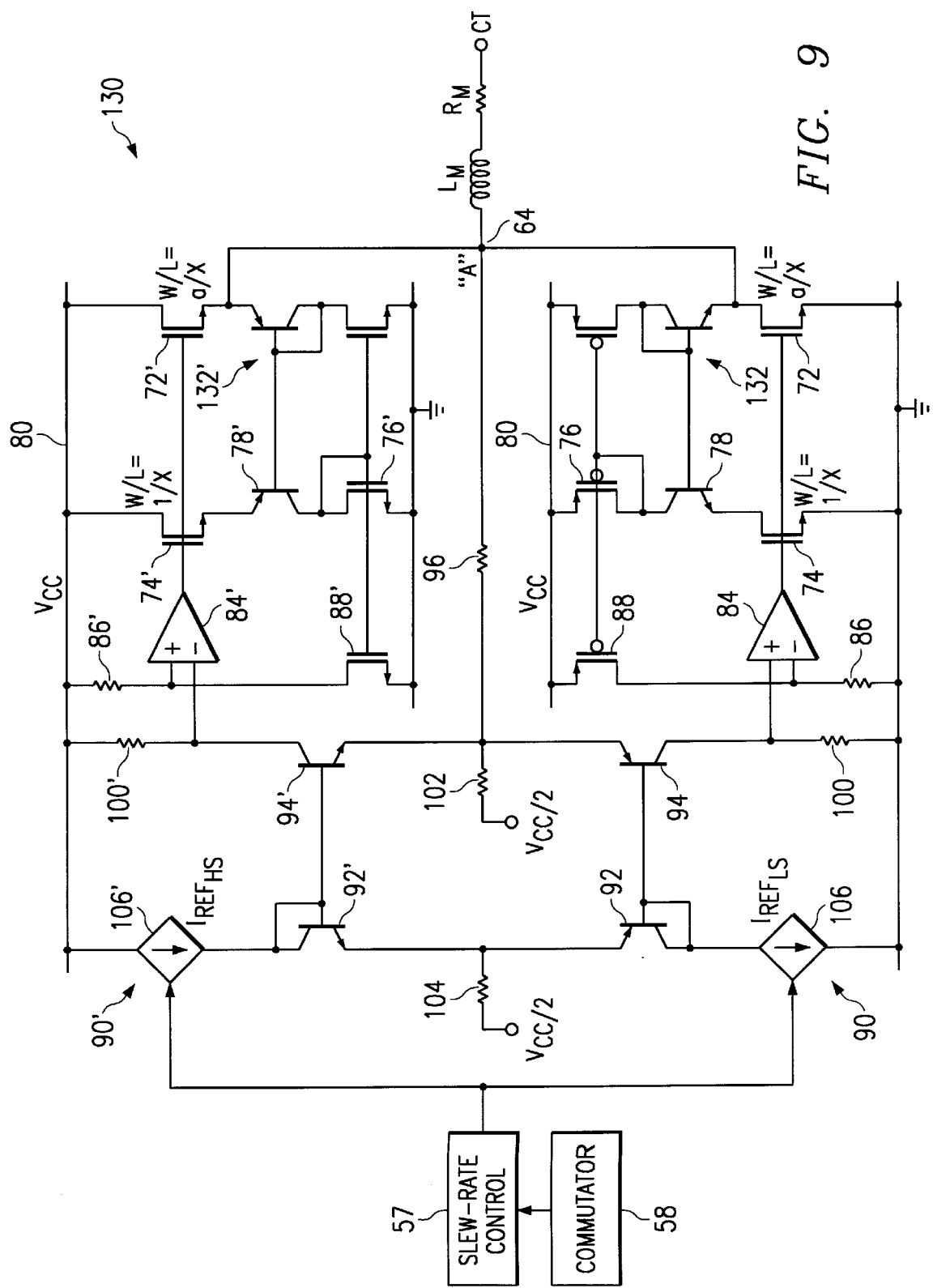
FIG. 9 shows an electrical schematic diagram of a complete current-mode power amplifier used for driving a phase of a dc motor, in accordance with the preferred embodiment of the invention.

A complete driver circuit 130 for a phase of a dc motor can be derived from FIGS. 5 and 6, as shown in FIG. 9. In the circuit of FIG. 9, it should be noted that the voltage-equalizing transistor 78 is controlled by a mirror circuit 132, instead of the high gain amplifier 85 described with reference to FIGS. 5 and 6. The current mirror 132 operates the transistor 78 to equalize the voltages of the output node 64 and the drain of the mirror transistor 76.

The closed-loop transfer function of the phase voltage to the input reference current can be expressed as follows:

$$\frac{V_{OUT}}{I_{REF}} = -\frac{1+GmR_{104}}{Gm} \frac{aR_M\left(1+\frac{s}{\omega_1}\right)}{\alpha aR_M\left(1+\frac{s}{\omega_1}\right)+(R_{102}//R_{96})+\frac{1}{Gm}}$$

where:

$$\omega_1 = \frac{R_M}{L_M}$$

$$\alpha = \frac{R_{102}}{R_{102}+R_{96}}$$

Gm = Transconductance of transistors 92 & 94 a = Ratio of power FET 72 to mirror FET 74

If $Req$ is defined as: $Req = \alpha aR_M + (R_{102}+R_{96})$

Then $\frac{V_{OUT}}{I_{REF}} = -\frac{1+GmR_{104}}{Gm} \frac{aR_M\left(1+\frac{s}{\omega_1}\right)}{\left(Req+\frac{1}{Gm}\right)+\alpha aR_M\frac{s}{\omega_1}}$ For $R_{104} \gg 1/Gm$ and $Req \gg 1/Gm$ $$\frac{V_{OUT}}{I_{REF}} = -\frac{R_{104}}{Req} \frac{aR_M\left(1+\frac{s}{\omega_1}\right)}{1+\frac{s}{\omega_2}}$$

where $$\omega_2 = \frac{Req}{\alpha aL_M} = \frac{\alpha aR_M+(R_{102}//R_{95})}{\alpha aL_M}$$

For $R_{104} = Req$ $$\frac{V_{OUT}}{I_{REF}} = -\frac{aR_M\left(1+\frac{s}{\omega_1}\right)}{1+\frac{s}{\omega_2}} \text{ and}$$

$$\frac{I_M}{I_{REF}} = \frac{a}{1+\frac{s}{\omega_2}}$$

This last equation describes the closed-loop transfer function of the phase current to the input reference current. As shown in the equations, an additional pole, which is set by resistors 102 and 96, limits the current bandwidth. Therefore, the high-frequency components of the phase voltage/current responses will be sufficiently attenuated. As long as the additional pole is set sufficiently high with respect to the low-frequency pole of $(R_M/L_M)$, the motor current response will follow the input reference current linearly with a stabilized phase voltage.

Figure 10:
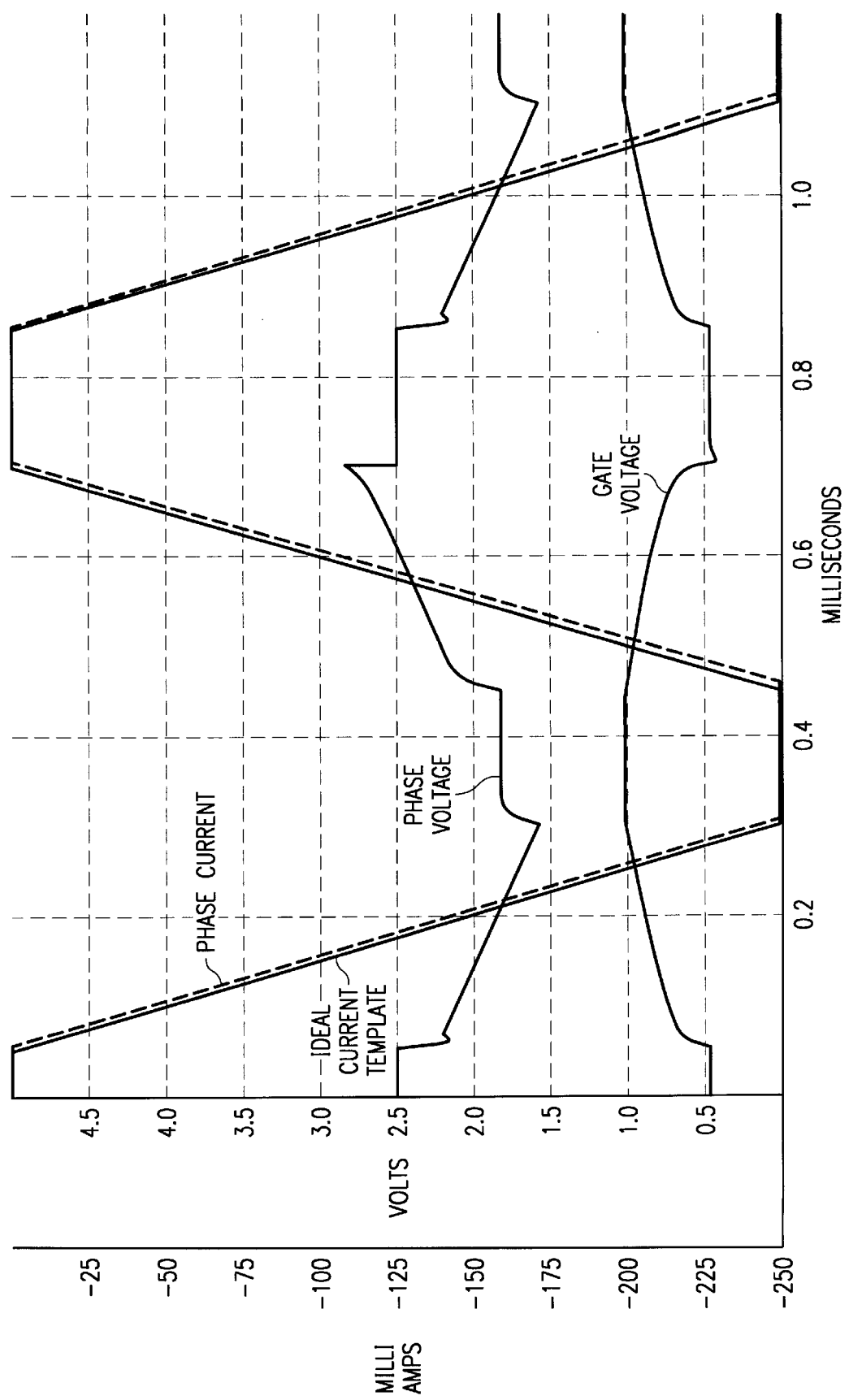
FIG. 10 shows graphs of phase current vs. time and phase voltage vs. time realized in the operation of the circuit of FIG. 5.

FIG. 10 depicts the step response obtained in the analysis of one of the driver circuits of the invention. More particularly, FIG. 10 shows graphs of phase current vs. time and phase voltage vs. time realized in the operation of the circuit of FIG. 5. The input reference current is set to 1 mA/μs As shown in the plot, the phase current follows the ideal current linearly while the phase voltage shows no high-frequency spikes or oscillations.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A slew rate controlled power amplifier for use in a dc motor driver circuit, comprising:
    a power transistor connected to control a drive current in said phase of said dc motor and to develop an output voltage on said phase in accordance with said drive current;
    a mirror transistor connected to establish a ratioed magnitude of said current in said power transistor;
    and a feedback circuit connected to controllably feed back said output voltage to said mirror transistor to control said drive current, and
    further comprising a commutatively operated slew-rate control circuit connected to said feedback circuit to control said drive current.

2. The slew rate controlled power amplifier of claim 1 wherein said feedback circuit comprises, in series, a bias current flowpath including a load resistor, a first bipolar transistor, and a current source controlled by said slew-rate control circuit, and a feedback current flowpath including, in series, an emitter resistor, a second bipolar transistor having a base connected to a base of said first bipolar transistor, and an output resistor.

3. The slew rate controlled power amplifier of claim 2 wherein said first bipolar transistor is connected in a common-base configuration, with said voltage output connected to an emitter.

4. The slew rate controlled power amplifier of claim 1 further comprising a feedback resistor between said output voltage and said emitter resistor of said feedback current flowpath to form a voltage divider therewith.

5. The slew rate controlled power amplifier of claim 1 wherein said first bipolar transistor is diode-connected.

6. The slew rate controlled power amplifier of claim 1 wherein said power transistor and said mirror transistor are MOS transistors.

7. The slew rate controlled power amplifier of claim 1 wherein said driver circuit is configured as a low-side driver power amplifier.

8. The slew rate controlled power amplifier of claim 1 wherein said driver circuit is configured as a high-side driver power amplifier.

9. The slew rate controlled power amplifier of claim 1 further comprising a voltage-equalizing transistor in series with said mirror transistor and an amplifier having a first input connected between said voltage-equalizing transistor and said mirror transistor, a second input connected to said output voltage and an output connected to control a current in said voltage-equalizing transistor, wherein said voltage-equalizing transistor tends to equalize voltages applied to said first and second inputs.

10. A driver circuit for a phase of a dc motor, comprising:
    a power transistor connected to control a drive current in a phase of said dc motor and to develop an output voltage on said phase;
    a mirror transistor connected to establish a ratioed magnitude of said drive current;
    an amplifier;
    a resistor;
    a current flowpath through said resistor to provide a reference voltage to one input of said amplifier; and a feedback current flowpath connected to receive said output voltage to feed back a voltage to another input of said amplifier;

and a bias current flowpath to establish a bias in said feedback current flowpath to control the current therein and the voltage fed back to said amplifier.

11. The driver circuit of claim 10 wherein said current in said bias current flowpath is controlled by a commutatively operated slew-rate control circuit.

12. The driver circuit of claim 11 wherein said bias current flowpath comprises a load resistor, a first bipolar transistor, and a current source connected in series, and said feedback current flowpath comprises an emitter resistor, a second bipolar transistor, and an output resistor connected in series.

13. The driver circuit of claim 11 further comprising a feedback resistor between said output voltage and said emitter resistor of said feedback current flowpath to form a voltage divider therewith.

14. The driver circuit of claim 11 wherein said first bipolar transistor is diode-connected.

15. The driver circuit of claim 11 wherein said power transistor and said mirror transistor are MOS transistors.

16. The driver circuit of claim 11 wherein said driver circuit is configured as a low-side driver power amplifier.

17. The driver circuit of claim 11 wherein said driver circuit is configured as a high-side driver power amplifier.

18. The driver circuit of claim 10 further comprising a voltage-equalizing transistor in series with said mirror transistor, and an amplifier having a first input connected between said voltage-equalizing transistor and said mirror transistor, a second input connected to said output voltage, and an output connected to control a current in said voltage-equalizing transistor, wherein said voltage-equalizing transistor tends to equalize voltages applied to said first and second inputs.

19. A driver circuit for a phase of a dc motor, comprising:

a power transistor connected to control a drive current in said phase and to develop an output voltage on said phase;

a mirror transistor connected to establish a ratioed magnitude of said current in said power transistor;

an amplifier having inverting and non-inverting inputs;

a resistor;

a current flowpath, including said resistor, connected to develop a control voltage for applications to the inverting input of said amplifier; and a feedback circuit connected to an output node of said driver circuit to feed back a voltage to the non-inverting input of said amplifier;

and a voltage-equalizing transistor in series with said mirror transistor and an amplifier having a first input connected between said voltage-equalizing transistor and said mirror transistor, a second input connected to said output voltage and an output connected to control a current in said voltage-equalizing transistor, whereby said first and second inputs tend to have equal voltage.

20. The driver circuit of claim 19 wherein said feedback circuit comprises a feedback current flowpath and a bias current flowpath to establish a bias in said feedback current flowpath to control the current therein in accordance with the current in said bias current flowpath.

21. The driver circuit of claim 20 wherein said bipolar transistor of said reference current flowpath is diode connected.

22. The driver circuit of claim 20 wherein said power transistor and said mirror transistor are MOS transistors.

23. The driver circuit of claim 20 wherein said driver circuit is configured as a low-side driver power amplifier.

24. The driver circuit of claim 20 wherein said driver circuit is configured as a high-side driver power amplifier.

25. The driver circuit of claim 20 wherein said bias current flowpath comprises a load resistor, a first bipolar transistor, and a current source connected in series, and said feedback current flowpath comprises a load resistor, a second bipolar transistor, and an output resistor connected in series.

26. The driver circuit of claim 20 wherein said current in said feedback current flowpath is controlled by a commutatively operated slew-rate control circuit.

27. The driver circuit of claim 20 further comprising a feedback resistor between said output node and said emitter resistor of said feedback current flowpath to form a voltage divider therewith.

28. A method for driving a dc motor, comprising:

controlling an output current in a phase of said dc motor to develop an output voltage on said phase;

controlling said output current according to a mirror current of a current mirror circuit; and feeding back said output voltage to said current mirror circuit to control said mirror current and said output current, and further comprising controlling said feed back output voltage in accordance with a predetermined slew rate.

29. The method of claim 28 further comprising providing a common-base amplifier circuit having a reference voltage applied to a base and the fed back voltage applied to the emitter to control said fed back voltage.

30. The method of claim 28 further comprising providing an amplifier to produce a difference between a reference voltage and said fed back voltage to control said current in said current mirror circuit.

31. A method for driving a dc motor, comprising:

controlling an output current in a phase of said dc motor to develop an output voltage on said phase;

controlling said output current according to a mirror current of a current mirror circuit; and feeding back said output voltage to said current mirror circuit to control said mirror current and said output current, and further comprising further controlling said mirror current in relation to a voltage difference between said output voltage and a voltage in said current mirror circuit.

32. The method of claim of claim 31 wherein controlling said mirror current in relation to a voltage difference between said output voltage and a voltage in said current mirror circuit comprises providing a transistor in said current mirror circuit, developing a voltage difference between said output voltage and said transistor, and controlling a current in said transistor in relation to said voltage difference to reduce said voltage difference.

* * * * *